(12) United States Patent
Weiser et al.

(10) Patent No.: US 7,077,533 B2
(45) Date of Patent: Jul. 18, 2006

(54) REFLECTING DEVICE FOR ELECTROMAGNETIC WAVES

(75) Inventors: Martin Weiser, Sinsheim (DE); Udo Dinger, Oberkochen (DE); Siegfried Stacklies, Abtsgmuend (DE); Markus Haidl, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/477,772

(22) PCT Filed: May 28, 2002

(86) PCT No.: PCT/EP02/05844

§ 371 (c)(1),
(2), (4) Date: Apr. 26, 2004

(87) PCT Pub. No.: WO02/099818

PCT Pub. Date: Dec. 12, 2002

(65) Prior Publication Data

US 2004/0174624 A1   Sep. 9, 2004

(30) Foreign Application Priority Data

Jun. 2, 2001   (DE) ................................ 101 27 086

(51) Int. Cl.
*G02B 5/08* (2006.01)
(52) U.S. Cl. ...................... 359/883; 359/359; 359/584; 204/192.34
(58) Field of Classification Search ........... 204/192.34; 359/359, 360, 584, 883; 430/5
See application file for complete search history.

(56) References Cited

U.S. PATENT DOCUMENTS

| | | | |
|---|---|---|---|
| 5,948,468 A * | 9/1999 | Sweatt et al. ................ 427/140 |
| 6,295,164 B1 | 9/2001 | Murakami et al. .......... 359/584 |
| 6,368,942 B1 * | 4/2002 | Cardinale .................... 438/459 |
| 6,377,655 B1 | 4/2002 | Murakami et al. ............ 378/84 |
| 6,387,572 B1 | 5/2002 | Tong et al. ..................... 430/5 |
| 6,776,006 B1 * | 8/2004 | Best et al. .................... 65/17.4 |
| 6,849,859 B1 * | 2/2005 | Folta et al. ............ 250/559.27 |
| 2001/0028518 A1 | 10/2001 | Kaiser ........................ 359/883 |

FOREIGN PATENT DOCUMENTS

EP   0 955 565 A2 * 11/1999

OTHER PUBLICATIONS

E. Spiller, et al., "Normal Incidence Optics for Solar Coronal Imaging", SPIE vol. 2515, pp. 136-145, Jun. 1995.*
Chuck Gwyn, et al. "EUV Lithography NGL Technology Review", EUV Lithography Program NGL Workshop, Chicago, Illinois, Jun. 9, 1999.*

(Continued)

*Primary Examiner*—Drew A. Dunn
*Assistant Examiner*—Derek Chapel
(74) *Attorney, Agent, or Firm*—Welsh & Katz, Ltd.

(57) ABSTRACT

A device serves for reflecting electromagnetic waves, in particular in a length range less than 200 nm. It has a mirror carrier made of a material with at least approximately vanishing thermal expansion and at least one reflective layer applied on said mirror carrier. An intermediate layer made of a material which is formed such that its surface roughness is not significantly increased after beam processing methods is fitted between the mirror carrier and the reflective layer.

11 Claims, 1 Drawing Sheet

OTHER PUBLICATIONS

P. Gailly, et al., "Ion Beam Figuring of small BK7 and Zerodur optics: thermal effects", SPIE vol. 3739, pp. 124-131, May 1999.*

W.M. Tong, et al., "Mask substrate requirements and development for extreme ultraviolet lithography (EUVL)", SPIE vol. 3873, pp. 421-428, Dec. 1999.*

U. Dinger, et al., "Mirror substrates for EUV-lithography: progress in metrology and optical fabrication technology", SPIE vol. 4146, pp. 35-46, Nov. 2000.*

M. Fruit, et al., "Ion Beam Figuring of SIC Mirrors Provides Ultimate WFE Performances for Any Type of Telescope", SPIE vol. 3739, pp. 412-154, Sep. 1999.*

C.M. Egert, et al., "Roughness Evolution of Optical Materials Induced by Ion Beam Milling", SPIE vol. 1752, pp. 63-72, Dec. 1992.*

P.B. Mirkarimi, et al., "Advances in the reduction and compensation of film stress in high-reflectance multilayer coatings for extreme ultraviolet lithography applications" UCRL-JC-128293 (Preprint), Feb. 1998.*

H.-J. Stock, et al., "Carbon buffer layers for smoothing superpolished glass surfaces as substrates for molybdenum/silicon multilayer soft-x-ray mirrors" Appl. Optics vol. 36, No. 7, Mar. 1, 1997, pp. 1650-1654.*

P.B. Mirkarimi, et al "Mo/Si and Mo/Be multilayer thin films on Zerodur substrates for extreme-ultraviolet lithography", Appl. Optics, vol. 39, No. 10, Apr. 1, 2000, pp. 1617-1625.*

P.B. Mirkarimi, et al "Recovery of multilayer-coated Zerodur and ULE optics for extreme-ultraviolet lithography by recoating, reactive ion-etching, and wet-chemical processes" Appl. Optics, vol. 40, No. 1, Jan. 2001, pp. 62-70.*

* cited by examiner

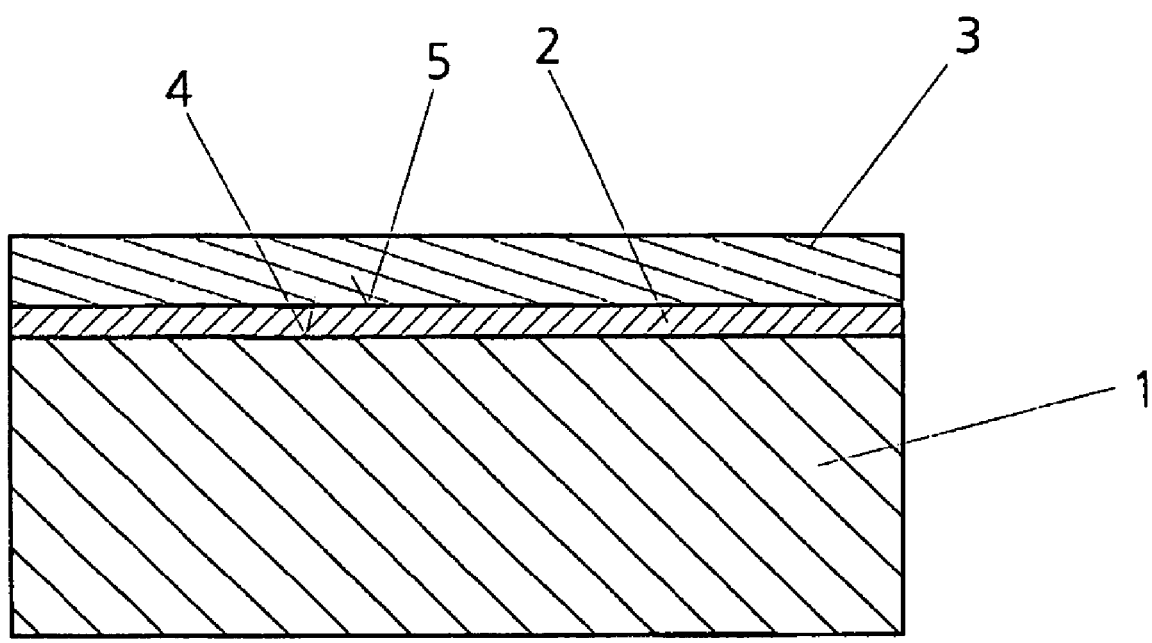

REFLECTING DEVICE FOR ELECTROMAGNETIC WAVES

BACKGROUND OF THE INVENTION

1. Field of the Invention

The present invention relates to a reflecting device for electromagnetic waves, comprising a mirror carrier made of a material with at least approximately vanishing thermal expansion and at least one reflective layer applied on said mirror carrier.

Moreover, the invention relates to a method for producing such a device for reflecting electromagnetic waves.

More specifically, the invention relates to electromagnetic waves in a wavelength range less than 200 nm.

2. Description of the Related Art

DE 198 30 449 A1 discloses a mirror substrate which comprises crystal and is provided with an amorphous layer of the order of magnitude of 1 to 100 μm, which allows a much higher polishing quality than the mirror substrate itself. In this case, the use of such a mirror is provided in EUV projection exposure installations.

In general, it is known that mirrors in EUV installations, for example EUV lithography systems, must have a very good figure, which means that the errors in the low spatial frequency range in EUV (spatial wavelengths $\geq 1$ mm) are small. Furthermore, such mirrors must have small roughnesses in the mid spatial frequency range (MSFR: mid spatial frequency roughness; at EUV spatial wavelengths typically between 1 μm$^{-1}$ and 1 mm$^{-1}$. It is furthermore known that part of the incident light is absorbed by the multilayer reflection layers that are customary and known per se, the so-called Distributed Bragg Reflectors (DBR), and converted into heat.

To ensure that the surface form of the mirror remains stable during operation under these thermal loads, it is necessary to use a material with the smallest possible thermal expansion coefficient as carrier material for such mirrors. In particular, mention shall be made here of glass-ceramic materials which are composed of a plurality of components having different thermal expansion coefficients, so that the material has macroscopically no or a vanishing thermal expansion coefficient. The materials sold under the proprietary names ZERODUR® or Clear Ceram® are applicable as an example of said material.

In addition to these requirements that are to be satisfied in the region of such mirrors, a very small roughness of approximately 0.1 nm rms of the surface must additionally be ensured in the region of high spatial frequencies (HSFR: high spatial frequency roughness; in EUV: spatial wavelengths $\leq 1$ μm), in order to ensure a corresponding reflectivity in the EUV region of the multilayer to be applied to the mirror surface.

According to the current prior art, the required HSFR in the region of approximately 0.1 nm rms can be achieved by means of superpolishing methods on various materials, such as quartz glass, ULE, silicon, or else on glass ceramics, such as ZERODUR® or Clear Ceram®. However, these superpolishing methods have the disadvantage that, at least when aspherical mirrors are used, generally the figures and, under certain circumstances, also the longer-wave MSFR components are impaired again, so that the superpolishing methods have to be followed by a fine correction process.

Particularly when using glass-ceramic materials, such as ZERODUR®, in which crystallites having a corresponding thermal expansion coefficient are embedded in an amorphous matrix having a different thermal expansion coefficient, a fine correction method, in particular based on ion beam figuring, leads to a serious impairment of the HSFR.

SUMMARY OF THE INVENTION

Therefore, it is the object of the invention to provide a device for reflecting electromagnetic waves, in particular in a wavelength range less than 200 nm, which has a mirror carrier made of a material with at least approximately vanishing thermal expansion coefficient, wherein the above-mentioned disadvantages with regard to the increase of the HSFR after a fine correction by means of beam processing methods are avoided.

According to the invention, this object is achieved by means of a reflecting device, wherein an intermediate layer made of a material which is formed such that its surface roughness is not significantly increased after beam processing methods is fitted between the mirror carrier and the reflective layer.

What can be achieved by virtue of the intermediate layer, which retains the surface quality with regard to HSFR present before the beam processing after a use of beam processing methods, such as, for example IBF (Ion Beam Figuring), is that, in the case of a mirror carrier made of a material with approximately vanishing thermal expansion, a correction by means of the beam processing methods, which operate very accurately and controllably, is made possible without the surface of the mirror carrier being impaired in the process before the application of the reflective layer to an extent such that a loss of reflectivity need be feared.

This is because the inventors have found that during the processing of such materials with vanishing thermal expansion, which, according to the currently known prior art, predominantly comprise, at least in the microscopic region, two or multiphase mixtures, the individual constituents are removed to different degrees by beam processing methods, so that the surface roughness achieved beforehand by means of superpolishing methods is impaired again after the beam processing.

By contrast, the intermediate layer made of a homogeneous material permits the beam processing without losses of quality with regard to HSFR, so that corrections in the context of the layer thickness of the intermediate layer are possible without any problems and without, in the process, impairing the surface roughness of the mirror carrier itself.

In particularly expedient refinements of the invention, at light wavelengths in the visible region, the intermediate layer comprises reflective material, in particular silicon.

In an intermediate layer made of silicon, what is additionally achieved, as shown in experiments, is that the surface quality with regard to HSFR can be improved again relative to the surface quality of the original surface, lying below the intermediate layer, by means of the beam processing of silicon. It is thus possible to achieve HSFR qualities which lie significantly below 0.1 nm rms. Such devices for reflecting electromagnetic waves are thus highly suitable even for electromagnetic waves having a wavelength in the range from 10 to 20 nm, in connection with the multi-layer reflection layers known per se, for achieving a very high reflectivity.

A method for producing a device which satisfies the object mentioned above is defined in greater detail by the characterizing part of claim 9.

In the method, it is provided that, in a first step, surface roughnesses which are less than or at least equal to 0.25 to 0.1 nm rms are realized by means of polishing or superpolishing methods known per se. In the next method step, the corresponding intermediate layer is then applied to the superpolished mirror carrier.

Since it is the case with superpolishing methods that small errors can very often occur in the region of the figure or of the longer-wave MSFR, these errors are corrected by means of beam processing methods on the surface form of the mirror carrier in the intermediate layer. In this case, with regard to its layer thickness, this intermediate layer must be configured such that the surface of the actual mirror carrier is not concomitantly processed during the beam processing methods.

In a final method step, a reflective layer, in particular as a multilayer layer known per se, is applied to the mirror carrier surface that has been processed in this way and satisfies the corresponding requirements with regard to the surface form, the figure and also MSFR and HSFR.

Consequently, for the first time one is able to use beam processing methods for effectively influencing the surface form with regard to figure and MSFR in the case of mirror carriers with vanishing thermal expansion, which usually comprise a glass ceramic with a multiphase mixture at least in the microscopic region.

Further advantageous refinements of the invention emerge from the remaining subclaims and the exemplary embodiment which is illustrated below with reference to the drawing.

CONCISE DESCRIPTION OF THE DRAWINGS

The single accompanying FIGURE shows a diagrammatic cross section through part of a mirror carrier with coating shown in a greatly exaggerated illustration.

The detail shows part of a mirror carrier 1 which is shown in a basic illustration with an intermediate layer 2 shown in a greatly exaggerated illustration and a reflective layer 3 formed, in particular, as a multilayer layer known per se (Distributed Bragg Reflectors/DBR). In order to meet stringent requirements with regard to the thermal stability, for example the requirements in EUV lithography objectives, the mirror carrier 1 must be formed from a material having an at least approximately vanishing thermal expansion, in order to remain uninfluenced, with regard to the imaging quality, by instances of heating which are unavoidable on account of radiation absorbed by the multilayer 3.

DETAILED DESCRIPTION OF THE INVENTION

In addition to these requirements with regard to the thermal expansion, the mirror carrier 1 must have, at its surface 4 which later carries the multilayer layer 3, very stringent requirements with regard to the figure, which is responsible for the imaging quality, with regard to the MSFR (mid spatial frequency roughness), which is responsible for scattering effects and contrast, and with regard to the HSFR (high spatial frequency roughness), which is responsible for the reflectivity. In order to be able to operate in the range of wavelengths below 200 nm, for example with X-ray waves in the range of $\lambda=10-20$ nm, for example the value of the HSFR must be significantly less than 0.5 nm rms, preferably 0.2 nm rms, particularly preferably 0.1 nm rms.

Conventional superpolishing methods are perfectly capable of obtaining such surface qualities with regard to HSFR. In the case of mirrors, in particular in the case of aspherical mirrors, the figure and longer-wave ranges of the MSFR suffer, however, as a result of these superpolishing methods.

It seems reasonable to attempt to correct these errors in the region of the figure and the longer-wave MSFR by means of beam processing methods, in particular by means of IBF (Ion Beam Figuring), since these methods are already used in other areas of optics for similar corrections of the FIGURE.

It has been shown, however, that a serious impairment of the HSFR occurs in the case of the materials that are used for the mirror carrier 1 and have at least approximately vanishing thermal expansion, during the beam processing.

The materials appropriate for the mirror carrier 1 are predominantly glass ceramics or other materials which are built up, at least in the microscopic region, from different phases, with different thermal expansion in each case. These different phases or different materials react to different degrees, however, that is to say with a removal rate of different magnitude, to the processing by means of IBF or comparable beam processing methods.

By way of example, in the case of the material sold under the proprietary name ZERODUR, which comprises a glass matrix with crystallites embedded therein, it is shown that, by means of IBF, the crystallites, which have a size of approximately 50 nm, are "prepared out" from the material surrounding them. The surface quality of the surface 4 with regard to HSFR is thereby seriously impaired.

This problem can be solved by the intermediate layer 2. To that end, the surface 4 is superpolished in a manner known per se by means of superpolishing methods to the corresponding surface requirements, for example HSFR=0.1 nm rms. This is followed by the application of the intermediate layer 2, which is applied in a comparatively thin layer thickness, for example a layer thickness of between 100 nm and 10 µm, so that the thermal expansion of the intermediate layer is negligible in comparison with the mirror substrate.

Customary coating methods can be used as method for applying the intermediate layer, sputtering having proved to be particularly suitable and readily manageable with regard to the process control, which is again responsible for the imaging of the quality of the surface 4 in the surface 5.

Using beam processing methods, it is now possible to effect a correction with regard to figure and longer-wave MSFR of the intermediate layer 2, so that a surface 5 of the intermediate layer 2, after this processing method, satisfies all the specifications and requirements with regard to thermal expansion, FIGURE, MSFR and HSFR.

The multilayer 3 known per se can then be applied as reflection layer to said surface 5 of the intermediate layer 2.

The material properties of the intermediate layer 2 must be selected such that the material of the intermediate layer reacts to beam processing methods by very uniform removal. To that end, the intermediate layer 2 may comprise, for example, silicon-containing materials such as quartz glass or the like. The use of silicon itself or metals is also conceivable. On account of the requirement that the figure of the surface 5 be measurable by means of interferometers, opaque materials are certainly preferable since they cause no disturbing interference from their layer thickness and, consequently, can be better detected by interferometric measurement methods.

Particularly expedient results, as have been shown, are produced when silicon is used for the intermediate layer 2. On account of its highly homogeneous construction, silicon reacts very positively to beam processing methods, in particular to IBF. The HSFR of IBF-processed silicon layers can additionally be increased relative to the HSFR of the layer provided below the silicon layer by means of the IBF processing, so that, when a silicon layer is used, it is possible to obtain a further improvement in the surface 5 relative to the surface 4 with regard to HSFR.

Thus, the intermediate layer 2 constitutes a layer which conserves the HSFR of the surface 4 or a layer which even improves it further when silicon is used, as in the manner mentioned above.

In principle, however, even with the use of layers which coarsely retain the HSFR or impair it at least only very slightly after the processing by IBF, a further superpolishing method on the intermediate layer 2 could be used to obtain the desired quality of the surface 5.

What is claimed is:

1. A reflecting device for electromagnetic waves, comprising a mirror carrier made of a glass-ceramic material with embedded crystallites and at least an approximately vanishing thermal expansion and at least one reflective layer applied on said mirror carrier, wherein an intermediate layer comprising quartz glass formed such that its surface roughness is not significantly increased after beam processing methods is fitted between the mirror carrier and the reflective layer.

2. The device as claimed in claim 1, wherein the electromagnetic waves are in a wavelength range less than 200 nm.

3. The device as claimed in claim 1, wherein the thickness of said intermediate layer lies between 100 nm and 10 µm.

4. A method for producing a device for reflecting electromagnetic waves, comprising making a mirror carrier of a material with at least approximately vanishing thermal expansion and applying at least one reflective layer on said mirror carrier, including the steps of superpolishing the mirror carrier so that the surface thereof is characterized by a roughness less than/equal to 0.25 nm rms at spatial frequencies greater than/equal to 1/µm; applying an intermediate layer to the superpolished mirror carrier, correcting the surface form of the mirror carrier by beam processing methods and, applying the reflective layer to the mirror carrier.

5. The method as claimed in claim 4, wherein the electromagnetic waves are in a wavelength range less than 200 nm.

6. The method as claimed in claim 4, further including the step of using as a multilayer layer as a reflective layer.

7. The method as claimed in claim 4, further including the step of polishing the intermediate layer.

8. The method as claimed in claim 4, further wherein us Ion Beam Figuring is the beam processing method used to correct the surface form.

9. The method as claimed in claim 4, further wherein said intermediate layer is applied to said mirror carrier by means of sputtering.

10. The method as claimed in claim 4, further wherein said intermediate layer is applied to said mirror carrier by means of electron beam evaporation.

11. A reflecting device for electromagnetic waves, comprising a mirror carrier having a surface and being made of glass ceramic with embedded crystallites and at least an approximate vanishing thermal expansion and at least one reflective layer, wherein an intermediate layer of quartz glass is located between the mirror carrier and the reflective layer, and wherein the intermediate layer is directly on the surface of the mirror carrier.

* * * * *

UNITED STATES PATENT AND TRADEMARK OFFICE
CERTIFICATE OF CORRECTION

| | |
|---|---|
| PATENT NO. | : 7,077,533 B2 |
| APPLICATION NO. | : 10/477772 |
| DATED | : July 18, 2006 |
| INVENTOR(S) | : Martin Weiser et al. |

It is certified that error appears in the above-identified patent and that said Letters Patent is hereby corrected as shown below:

Column 1, line 30: ...."between 1 pm-1 and 1 mm-1." should read
-- ...between 1 pm-1 and 1 mm-1).--

Column 6, line 13: "us" should be deleted

Signed and Sealed this

Twenty-third Day of January, 2007

JON W. DUDAS
*Director of the United States Patent and Trademark Office*

UNITED STATES PATENT AND TRADEMARK OFFICE
CERTIFICATE OF CORRECTION

PATENT NO. : 7,077,533 B2 Page 1 of 1
APPLICATION NO. : 10/477772
DATED : July 18, 2006
INVENTOR(S) : Weiser et al.

It is certified that error appears in the above-identified patent and that said Letters Patent is hereby corrected as shown below:

Column 1, line 30
Please delete "... between 1 µm-1 and 1 mm-1 ..."

Column 6, line 13
Please delete "us"

Signed and Sealed this

Fourth Day of September, 2007

JON W. DUDAS
*Director of the United States Patent and Trademark Office*